United States Patent [19]
Skrabek et al.

[11] 3,945,855
[45] Mar. 23, 1976

[54] THERMOELECTRIC DEVICE INCLUDING AN ALLOY OF GeTe AND AgSbTe$_2$ AS THE P-TYPE ELEMENT

[75] Inventors: Emanuel Andrew Skrabek, Baltimore; Donald Smith Trimmer, Timonium, both of Md.

[73] Assignee: Teledyne, Inc., Los Angeles, Calif.

[22] Filed: Mar. 8, 1972

[21] Appl. No.: 232,761

Related U.S. Application Data

[60] Division of Ser. No. 8,043, Feb. 2, 1970, Pat. No. 3,695,867, which is a continuation-in-part of Ser. No. 593,469, Nov. 10, 1966, abandoned, which is a continuation-in-part of Ser. No. 509,511, Nov. 24, 1965, abandoned.

[52] U.S. Cl. ............... 136/238; 136/239; 136/240; 136/241; 252/62.3 T
[51] Int. Cl. .............................................. H01v 1/18
[58] Field of Search .......... 136/238, 239, 240, 241; 252/62.3 T

[56] References Cited
UNITED STATES PATENTS

| | | | |
|---|---|---|---|
| 3,061,657 | 10/1962 | Hockings | 136/238 |
| 3,073,883 | 1/1963 | McHugh et al. | 136/238 |
| 3,211,656 | 10/1965 | Rupprecht | 136/238 X |
| 3,249,469 | 5/1966 | Stegherr | 136/238 X |

Primary Examiner—Carl D. Quarforth
Assistant Examiner—E. A. Miller
Attorney, Agent, or Firm—Fleit & Jacobson

[57] ABSTRACT

Improved alloys suitable for thermoelectric applications and having the general formula:

$$(AgSbTe_2)_{1-x} + (GeTe)_x$$

wherein $x$ has a value of about 0.80 and 0.85, have been found to possess unexpectedly high thermoelectric properties such as efficiency index, as well as other improved physical properties.

3 Claims, 9 Drawing Figures

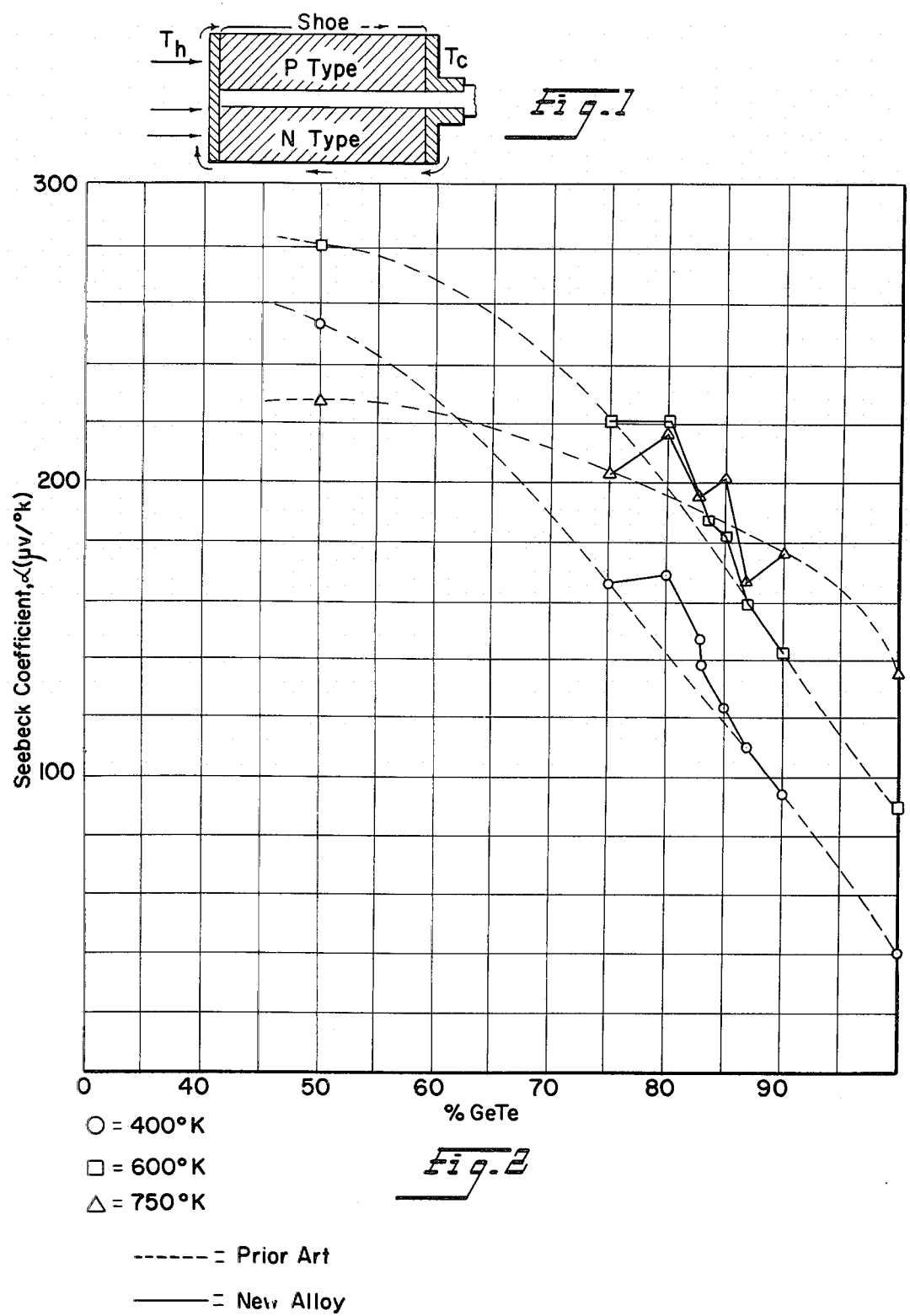

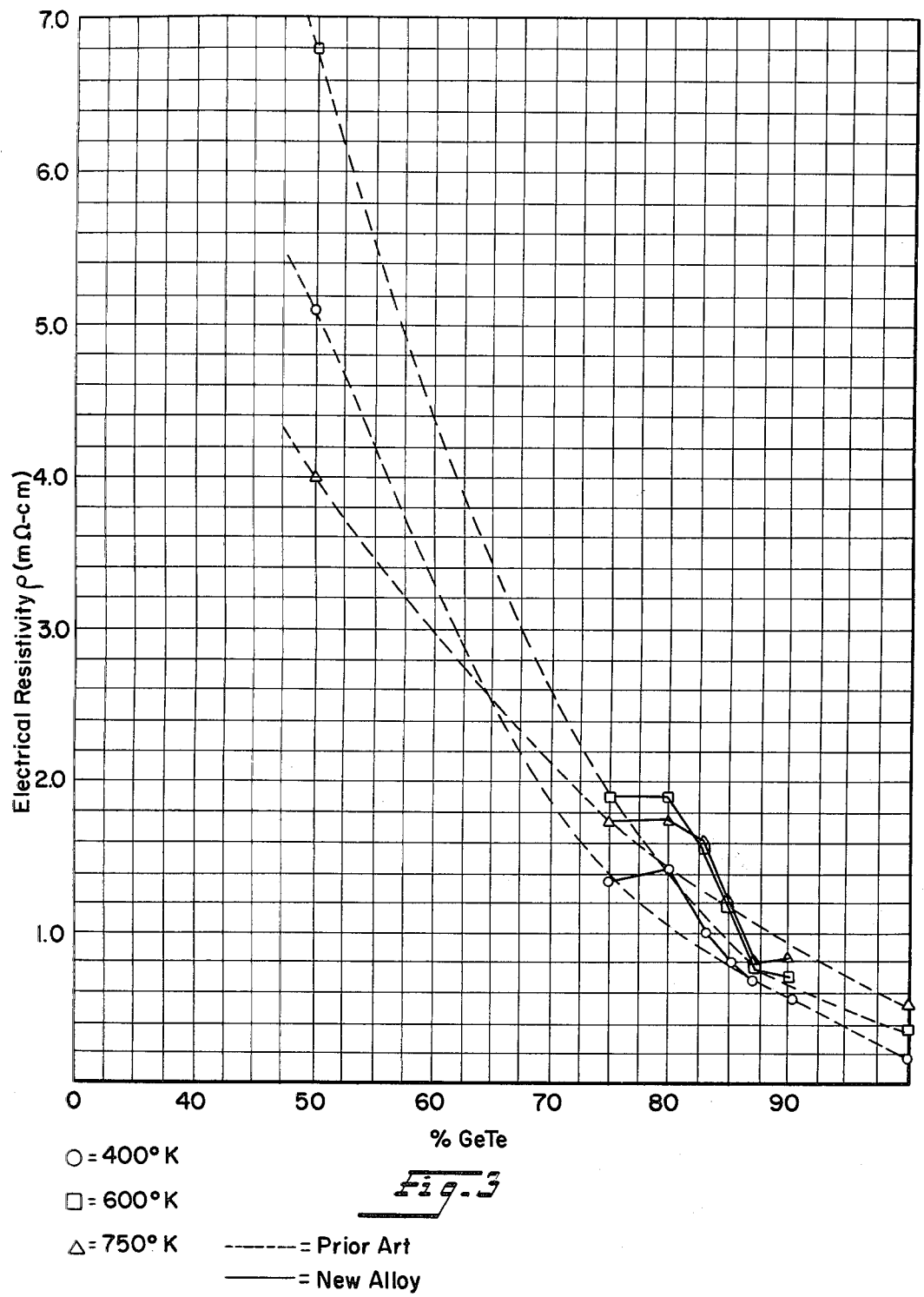

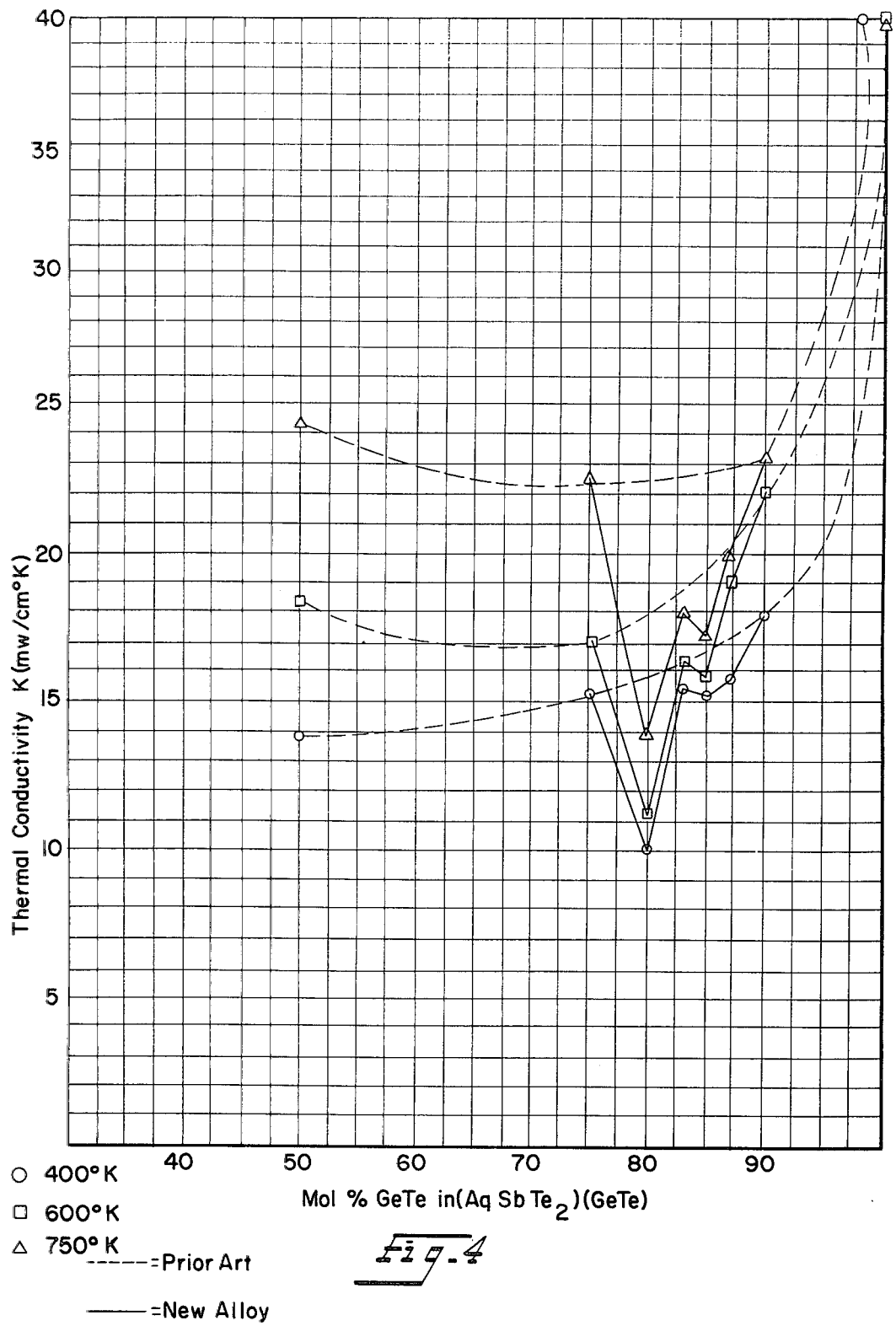

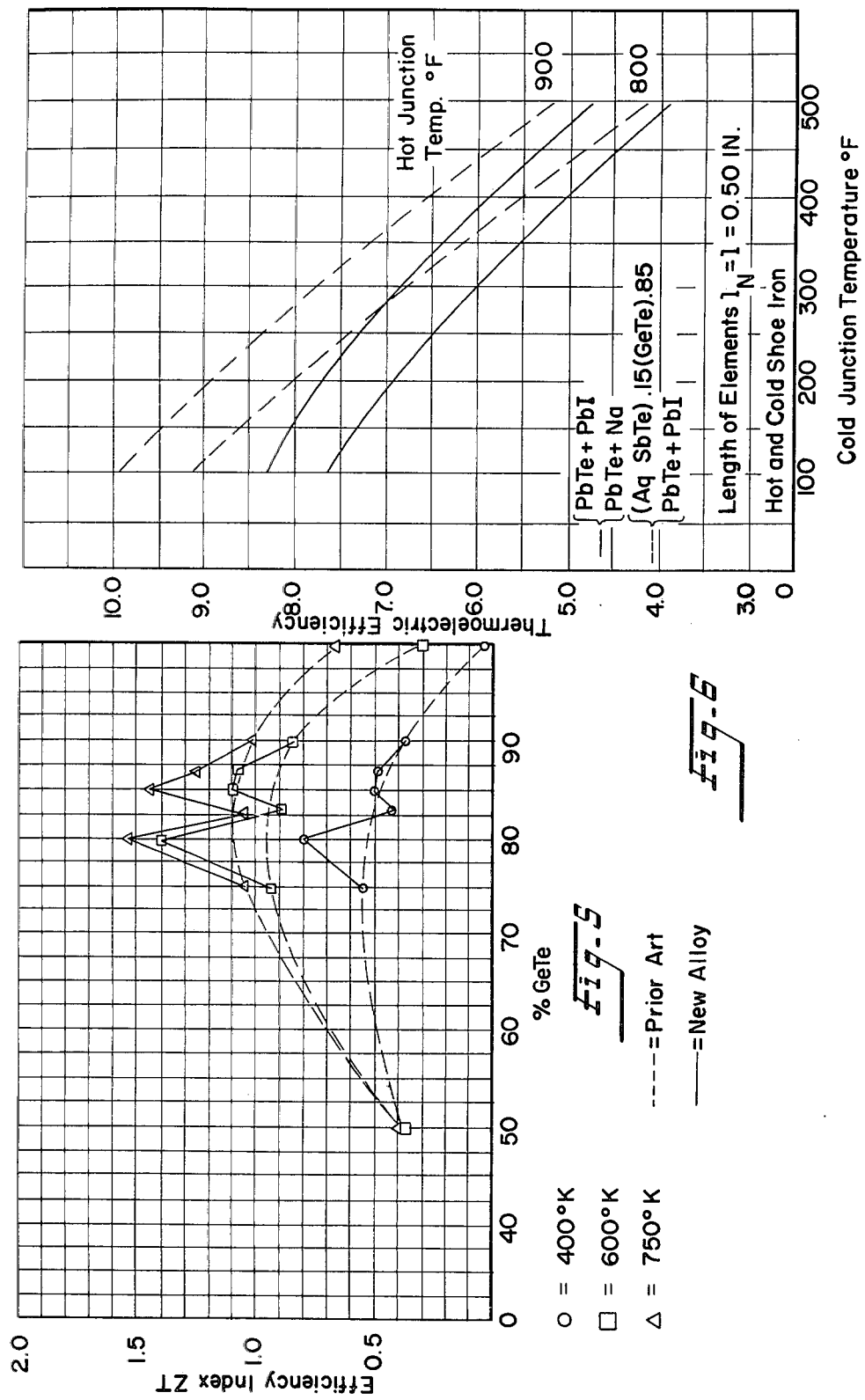

THERMOELECTRIC DEVICE INCLUDING AN ALLOY OF GETE AND AGSBTE AS THE P-TYPE ELEMENT

This is a division of application Ser. No. 8,043, filed Feb. 2, 1970, now U.S. Pat. No. 3,695,867, which is a continuation-in-part of application Ser. No. 593,469, filed Nov. 10, 1966, now abandoned, which was a continuation-in-part of application Ser. No. 509,511, filed Nov. 24, 1965, now abandoned.

This invention relates to novel alloys having the general formula $(AgSbTe_2)_{1-x} + (GeTe)_x$, wherein $x$ is expressed in mol fractions, and containing both rhombohedral and face centered cubic crystals. More particularly, the present invention relates to new and improved thermoelectric alloys and thermoelectric devices containing the novel alloys.

Thermoelectric conversion devices have received a great deal of attention in recent years for numerous terrestrial and space applications. Consequently, both government and private industry have expended large funds in research and development efforts to obtain suitable alternatives for the lead telluride elements and, more hopefully, to obtain new elements with better thermoelectric and physical properties for operation in the same temperature range. However, in spite of this intense activity in the thermoelectric field, lead telluride has remained the material exhibiting the best electrical properties known to be used commercially in this temperature range at the present time.

A limited number of compositions, or alloys, which may be represented by the formula $(AgSbTe_2)_{1-x} + (GeTe)_x$, wherein $x$ equals parts by mol fraction, are known and have been proposed as thermoelectric elements in thermoelectric devices. However, so far as known, none of these known alloys have been used in commercial devices. Patent literature and technical reports have indicated that this lack of commercial usage is attributable to the fact that known alloys of the type set out above, are not superior, or are even inferior, in their overall thermoelectric efficiency and physical attributes to the known and widely used lead telluride thermoelectric elements which operate in approximately the same temperature range.

In particular, the article *Semiconductor Materials for Thermoelectric Power Generation Up to 700°C*, F. D. Rosi, J. P. Dismulles, and E. F. Hockings, published in "Electrical Engineering", Vol. 79, p. 450 (1960) and U.S. Pat. No. 3,061,657 to E. F. Hockings generally agree in the conclusion that the alloy of the above-noted type containing 90°% GeTe and 10% AgSbTe₂ is the best of this type for thermoelectric conversion. In fact, while there is some discussion in the prior art of the properties of these alloys, no indication is given of any suspected or enhanced properties for these alloys in the range between 50 and 90 mol percent GeTe.

Now in accordance with the present invention, it has been found, that, contrary to the teaching of the prior art, for two distinct alloy compositions having the general formula $(AgSbTe_2)_{1-x} + (GeTe)_x$, wherein $x$, expressed in mol fractions, is about 0.80 and 0.85, distinctly superior thermoelectric and physical properties are found compared with other alloy compositions having the same general formula in the 50–90 mol percent GeTe range. More particularly, it has been found that the alloys of the present invention, which have the above-noted general formula, possess unexpected properties in thermoelectric power electrical resistivity, thermal conductivity, lattice spacing, and thermal expansion.

Thus, while according to the prior art, the Seebeck coefficient ($\alpha$) [thermoelectric power] and resistivity ($\rho$) are indicated in the prior art as smoothly decreasing with the addition of more GeTe to the AgSbTe₂, according to the present invention there is seen to be an unexpected fluctuation in both of these properties in the 80% and 85% GeTe range (FIGS. 7 and 8 of the application), so that, in fact, substantial peaks in the efficiency index, ZT are found at 80% and 85% GeTe.

Further, the prior art indicates that these materials form a simple solid solution. Data obtained according to the present invention using differential thermal analysis technique (FIG. 9), however, shows the existence of another phase in the 80% to 90% GeTe region.

Lattice parameter data shown in the prior art gives no indication of a lattice contraction, while FIG. 7 definitely shows a contraction of the lattice around the 85% GeTe-15% AgSbTe₂ composition. This data was obtained using a General Electric XRD-5 X-ray diffraction unit using Copper K$\alpha$ irradiation. (Note that FIG. 7 here gives the spacing for the 200 lines which are the most intense lines of the pattern. Below 75% GeTe this is exactly one-half the lattice parameter, while above this composition it is within 0.3% of being one-half the lattice parameter. E.g. the value of 2.980A reported for GeTe here calculates to 5.980 A for the lattice parameter, as compared to 5.988 A reported in the literature.) FIG. 8 shows a minimum in the thermal expansion ($\Delta L/L\Delta T$) at the 85% GeTe—15% AgSbTe₂ composition, again pointing up the unusual features of this composition. This data was obtained with a Leitz HTV dilatometer.

Significantly, the prior art mentioned above asserts that in the 50–90% GeTe range there is an absence of a minimum in the lattice contribution to thermal conductivity, $K_{ph}$, and therefore no minimum in total thermal conductivity, $K_t$, since $K_T = K_{ph} + K_{el}$, where $K_{el}$ is the electronic contribution to thermal conductivity and $K_T$ and $K_{el}$ are shown to be monotonically increasing throughout the indicated alloy composition range. The present inventors have found, however, that contrary to what the prior art asserts there are definite and pronounced minima in $K_T$ at about 80% GeTe-20% AgSbTe₂ and 85% GeTe-15% AgSbTe₂ (FIG. 4).

The unexpected properties of the alloys of this invention, which are the same type of near-degenerate semiconductors as the kindred known alloys, namely, p-type, have been compared with those of the most nearly analogous heretofore known alloys in order to illustrate the significant advance in the art represented by this invention. In all instances extreme care has been exercised to utilize only recognized and well established evaluative techniques and standards, and to use identical techniques on all samples tested. An average value for at least four samples in all instances and 12 and 38 samples, respectively, when GeTe represented 80 and 85% of the alloy was used for the data presented here. A schematic illustration of a thermoelectric device and the evaluative comparisons are set out in the accompanying drawings in which:

FIG. 1 is a schematic cross-sectional view of a thermoelectric device for converting heat energy into electrical energy through utilization of the Seebeck effect;

FIG. 2 is a graph showing a comparison of the Seebeck coefficient ($\alpha$) for the most nearly related prior art alloys and the alloys of this invention at representative temperatures over the normally operating temperature gradient for thermoelectric devices using the alloys of this invention as thermoelectric elements;

FIG. 3 is a graph similar to the graph of FIG. 2 relating to electrical resistivity ρ;

FIG. 4 is a graph similar to the graph of FIG. 2, relating to thermal conductivity K;

FIG. 5 is a graph similar to the graph of FIG. 2, representing the efficiency index ZT where $T = °K$ and $Z = α^2/ρK$ in which $K$ represents thermal conductivity in Watts/°K cm;

Figure 7:
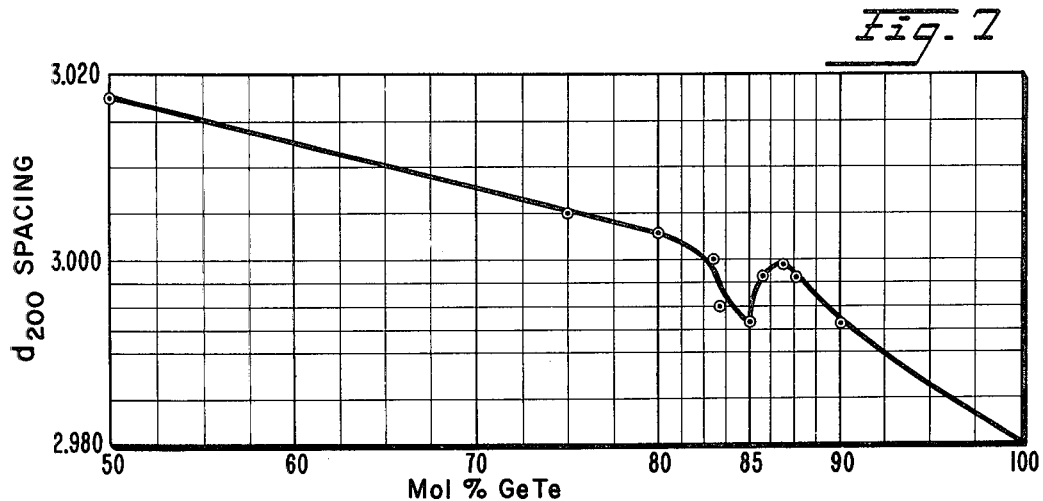
Figure 8:
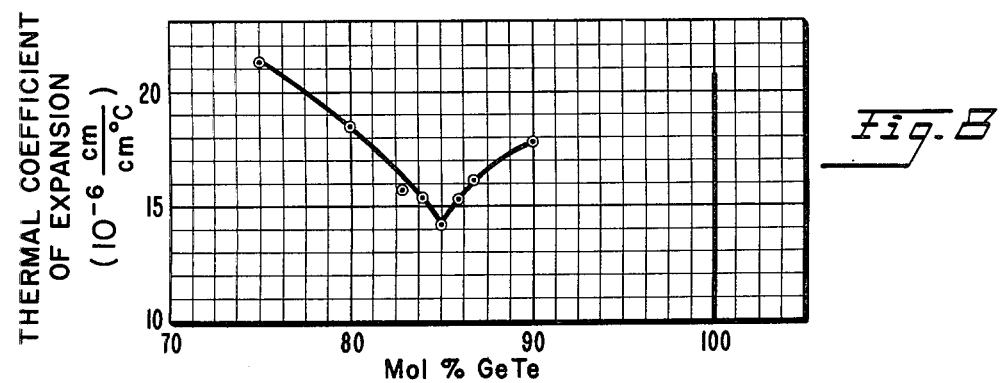

FIG. 6 is a graph representing the energy conversion efficiency of thermoelectric devices, respectively, using a preferred alloy of this invention and commercial lead telluride doped with sodium as a P-type element, while, in each instance, using commercial lead telluride doped with lead iodide as the N-type element; the calculations being made in each instance in conformity with the recognized formula for efficiency, namely, $$\text{Eff} = \frac{T_h - T_c}{T_h} \cdot \frac{\sqrt{1 + ZT} - 1}{\sqrt{1 + ZT} + \frac{T_c}{T_h}}$$

wherein $T_h$ + temperature on hot side, $T_c$ + temperature on cold side and $ZT$ + efficiency index of the couple averaged over the operating temperature range;

FIG. 7 shows X-ray diffraction lattice data, $d_{200}$ spacing as a function of alloy composition;

FIG. 8 shows thermal expansion as a function of alloy composition; and

Figure 9:
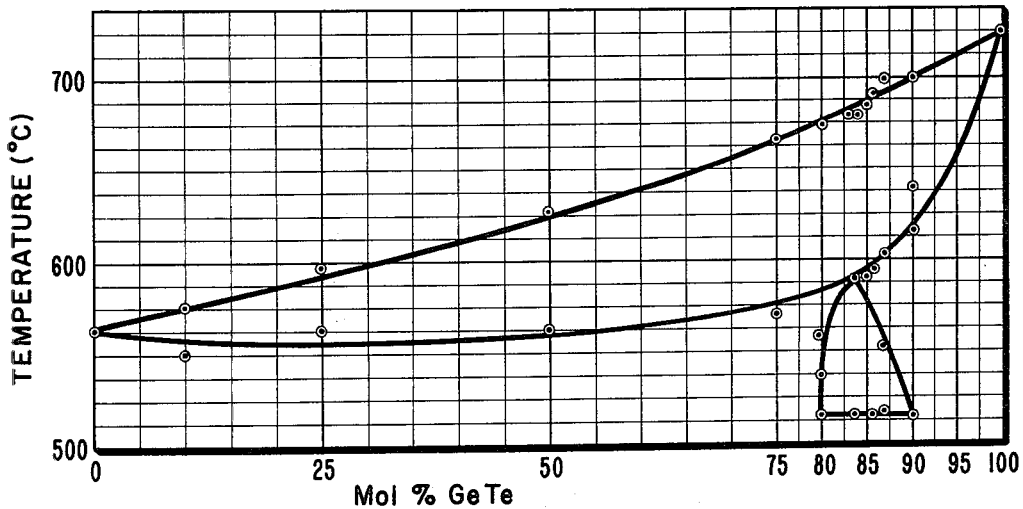

FIG. 9 is a phase diagram for varying alloy composition.

In FIG. 5, the ZT data for 100% GeTe is well known and well established in the art and is taken from *Thermoelectricity: Science and Technology* by R. R. Heikes and R. W. Ure, Jr., Interscience Publishers, 1961 (page 435).

In order to supplement the information presented graphically in FIGS. 2–5, Table I present thermoelectric property data shown in those figures taken at 750°K. Also included in Table I are thermoelectric property data for hypothetically stoichiometric materials not plotted in FIGS. 2–5, but which are consistent with the curves shown in those graphs.

cess was completely unsatisfactory because of poor mechanical integrity, i.e., they split and crumbled during the pressing operation. For instance, a series of samples consisting of finely divided particles of $(AgSbTe_2)_{0.15}(GeTe)_{0.85}$ and of size conventionally used for cold pressing and sintering were first compressed at a series of pressures between 25 and 55 tsi and thereafter sintered in an argon atmosphere for four hours at temperatures of 582°C, 604°C and 627°C. In each instance the sintered material had mechanical defects set out above.

It was then found that this problem was eliminated, particularly in the case of the novel alloys of this invention, by utilizing a casting technique. More particularly, the alloys were prepared by placing the four constituent elements in the desired correct proportions in an evacuated Vycor tube and then sealing the tube and heating it in a rocking furnace at 750°C for one hour, i.e., until a melt was formed. The tubes were slowly cooled to approximately 600°C and annealed at this temperature for sixteen hours. Thereafter, the tubes were permitted to cool to ambient temperature.

Additionally, some of this cast material was further processed by being converted to finely divided particles, as by crushing to −35 mesh, cold compacted at 20,000 psi and then hot pressed at 525°C and 5000 psi for about one-half hour to form a p-type thermoelectric element. Substantially the same thermoelectric properties were exhibited by the cast samples as with the samples which were further processes in this manner.

The thermoelectric materials of this invention have been designated "alloys" for they appear to be solid solutions and there is no discovered evidence of compound formation, for the Stoichiometric compositions do not seem to differ, apart from concentration of ingredients, from the non-stoichiometric compositions. Basically, microprobe analysis indicates a matrix of Ag-Sb-Ge-Te with a small amount of AgTe scattered throughout. In the higher Ge-content material, a minor phase of Ge may exist.

It would appear such alloys are unobtainable apart from the formation of a true melt, for otherwise one would have a suspension of higher melting metals, or alloys, in lower melting metals, or alloys.

X-ray diffraction studies indicate the materials of

TABLE I

| Thermoelectric Performance Data at 750°K | | | | | |
|---|---|---|---|---|---|
| Percent GeTe | AgSbTe$_2$ | α(μV/°K) | (mΩcm) | K(mw/cm-°K) | ZT |
| 50* | 50 | 228 | 4.00 | 24.3 | .39 |
| 75* | 25 | 204 | 1.72 | 21.5 | 1.04 |
| 80 | 20 | 219 | 1.76 | 13.4 | 1.52 |
| 83 | 17 | 197 | 1.57 | 17.7 | 1.04 |
| 83-1/3 | 16-2/3 | 184 | 1.35 | 20.0 | 0.89 |
| 85 | 15 | 198 | 1.19 | 17.3 | 1.43 |
| 85-5/7 | 14-2/7 | 194 | 1.12 | 21.9 | 1.16 |
| 87 | 13 | 167 | .87 | 20.0 | 1.25 |
| 87-1/2 | 12-1/2 | 168 | .95 | 20.5** | 0.88 |
| 90* | 10 | 177 | .82 | 23.0 | 1.01 |

*Corresponds to values obtained in U.S. Patent 3,061,657 to Hockings.
**Value obtained by interpolation.

Since heretofore disclosed most nearly related alloys are not commercially available, in order to make a comparison between the novel alloys of this invention and such prior art alloys, it was necessary to produce all samples tested. Initially, it was attempted to produce sample thermoelectric elements by a cold pressing and sintering process. However, it was found that this pro- 90%, or greater content, in GeTe have a rhombohedral crystal structure with a lattice angle very near 90°, while materials with 75% or less GeTe content have a face centered cubic crystal structure. Both of these structures are observed in the materials having a GeTe content between 75% and 90%. Thus, it appears optimum results require the presence of both types of crystal structures. Yet, optimum ZT values vary from the median ZT value indicating further that optimum results also require that the two types of crystals be present in unequal amounts as indicated by peaks at about 80% and 85% GeTe. respectively. It will be noted that there are values of ZT value projectable from prior art knowledge. This double peaking characteristic of the ZT curve is an extremely unusual occurrence. Electron microscope observation of the 85% and 80% GeTe alloys indicate the former has a more disordered structure than the latter.

Preliminary investigations indicate a slight shrinkage of the lattice in the immediate vicinity of the 85% GeTe region which explains to some extent the exceptional physical stability of this alloy.

The graphs shown in FIGS. 2, 3 and 4 serve primarily to facilitate an understanding of the graphs of FIGS. 5 and 6. Thus, FIGS. 2, 3, and 4 will not be discussed. The efficiency index graph shown in FIG. 5, the most widely accepted evaluation of thermoelectric efficiency, strikingly illustrates the peaking of thermoelectric efficiency in the two regions of 80% GeTe-20% AgSbTe$_2$ and 85% GeTe-15% AgSbTe$_2$. The peaking of the efficiency index at these two points exhibits a definite and unexpected departure from the curve projected from the prior art based on the properties of the previously disclosed materials containing 50, 75, 90 and 100% GeTe. It will be observed, moreover, that in the higher and preferred operable temperatures, illustrated by 750°K., the largest departures occur for both the 80% and 85% GeTe materials. The measured results of FIG. 5 were used in determining the data of FIG. 6, which illustrates the remarkably superior characteristics of the preferred alloys of this invention over P-type lead telluride thermoelectric elements, now commonly used in thermoelectic devices.

FIG. 6 is significant, also, in showing the exceptionally high conversion efficiency of the alloys of this invention at conventional operating temperatures. For instance, with a hot junction temperature of 900°F. and a cold junction temperature of 100°F., the thermoelectric efficiency approaches 10%. This efficiency is significantly greater than the 4–8% obtainable with heretofore known materials in such now commonly used thermoelectric devices.

In view of reports of physical failure in known compositions containing Ag, Sb, Te, and Ge, prepared for use as thermoelectric elements, samples of the preferred alloys of this invention, prepared in conformity with the disclosed recommended procedure, set out above, have been compared with the samples of P-type lead telluride of the same size and configuration. The lead telluride was purchased from a leading manufacturer who uses the cold press and sintering process for fabrication of elements.

In conformity with established testing techniques, the samples were compared as to compression strength. Tests performed on the two materials demonstrated a significant difference in the compression strength between the lead telluride and the preferred alloys containing 85% GeTe. All four of the lead telluride samples tested failed when the pressure on the ends of the samples reached 12,000 to 15,000 psi. On the other hand, the preferred alloys, which were prepared by hot pressing, showed only a slight degree of chipping on the edges at a a pressure of 14,500 to 29,000 psi and complete failure did not occur until the pressure reached 20,000 to 35,000 psi. Cast samples of the preferred alloy showed some chipping at 19,000 to 22,000 psi and total failure took place at 20,000 to 22,400 psi. Thus, the compression strength of the alloy is approximately twice that of lead telluride. Also, in conformity with established techniques, the samples were compared on the basis of impact strength. The preferred alloys, which were prepared by hot pressing, exhibited no failure after ten impact tests had been performed on each of the samples. The cast elements of the same material failed after six tests. However, all of the lead telluride samples cracked on the first test and completely split apart on the second test. The impact tests, thus again, demonstrated significant superiority of the alloy material over that of the most nearly competitive commercial composition of lead telluride.

Others, working with known kindred combinations of Ag, Sb, Ge and Te, have experienced serious physical element damage resulting from thermal cycling. In this regard, it should be noted that damage, due to thermal cycling, is more likely to occur in materials which exhibit a high coefficient of linear thermal expansion. Using standard dilatometry techniques, measurements were made on representative and preferred alloys of this invention as well as on prior known most nearly analogous alloys. The results are presented in Table II.

TABLE II

| Mol % GeTe in Alloy | Average Coefficient of Linear Thermal Expansion from Room Temperature to 300°C Coefficient of Expansion $10^{-6}$ cm/cm°C |
|---|---|
| 75 | 21.3 |
| 80 | 18.5 |
| 83 | 15.6 |
| 85 | 14.1 |
| 87 | 16.1 |
| 90 | 17.9 |

It will be observed that, while the 80% GeTe material of this invention exhibits an efficiency index ZT somewhat superior to that of the 85% GeTe material at certain operating temperatures, the improved thermal cycling characteristics of the latter material nevertheless makes its use more desirable in many applications. For instance, samples containing 85 mol % GeTe and 15 mol % AgSbTe$_2$ have been thermally cycled more then 25 times at a heating and cooling rate of approximately 50°C. per minute with no apparent physical damage to the samples.

The hot and cold shoes of the thermoelectric couples (see FIG. 1) should be selected from those materials having good electrical and thermal conductivity characteristics and which are sufficiently compatible, both chemically and physically, with the P-type thermoelectric elements disclosed herein and the particular N-type thermoelectric element to be employed. The suitable shoe material may generally be selected from those previously found satisfactory for use with telluride based alloys such as iron, molybdenum, tungsten and tantalum.

Thermoelectric devices using P-type elements disclosed herein have been successfully fabricated using a lead tin telluride N element and an iron hot shoe. The novel thermoelectric elements of this invention have been bonded to the shoe using both bismuth tellurium and tin tellurium braze alloys with a nickel braze material being used to bond the lead tin telluride thermoelectric element to the shoe. Several of these devices have been operated for over 1000 hours at a significantly higher output performance than could be obtained using commercially available materials at a temperature difference of about 400°K with the hot shoe at approximately 750°K. The materials used in these particular shoes were procured from the Crucible Steel Company of America, Pittsburgh, Pennsylvania, and are identified as their Ferrovac E material.

In addition, a thermoelectric device comprised of a P-type element 85% mol % GeTe - 15 mol % $AgSbTe_2$ and a commercially available lead tin telluride N element utilizing a hot shoe of the type described in copending application, Ser. No. 423,229, filed Jan. 4, 1965, assigned to the common assignee, has been operated for a period in excess of 7,000 hours with no degradation in electrical output.

Although the evaluations shown in FIG. 6 use lead iodide doped lead telluride as the N-type element in a thermoelectric device, due to the prior use thereof in combination with sodium doped lead telluride as a P-type element in thermoelectric devices, it has been found the P-type thermoelectric elements of this invention may be used quite satisfactorily in combination with other known N-type thermoelectric elements in thermoelectric devices. For instance, the novel alloys of this invention may be fabricated as a P-leg of a thermoelectric device and used advantageously in combination with a lead tin telluride doped with lead iodide known to be suitable for such use as an N-leg. Typically, lead, tin, tellurium, and the lead iodide dopant would be present in a molar ratio, respectively of 0.85 : 0.15 : 1.0 : 0.000625 in such an N-leg.

From the foregoing, it would appear no one has heretofore produced an alloy of Ag-Sb-Ge-Te with a crystal structure containing both rhombohedral and face-centered cubic crystals, or any such alloy which has a Zt value in excess of 1.3 or more, such as 1.4, or 1.5, at 750°K. Also, the prior art discloses no such alloys with a coefficient of expansion, expressed in $10^{-6}$ cm/cm-°C below 15.0, or 16.0, such as 14.1 for the 85% GeTe alloy which may be contrasted with the coefficient of expansion of 21.3 for the 75% GeTe alloy and 17.9 for the 90% GeTe alloy which are the most closely related known Ag-Sb-Ge-Te alloys.

It will be apparent to those skilled in the metallurgical arts and the thermoelectric arts that many variations may be made in the detailed disclosure, set out herein for illustrative purposes, without departing from the spirit or scope of the invention as set out in the appended claims.

What is claimed is:

1. A thermoelectric device comprising a P-type element consisting essentially of an alloy of GeTe and $AgSbTe_2$, containing both rhombohedral and face-centered cubic crystals and having a ZT value in excess of 1.3 at 750°K, an N-type element formed of a compatible material, and a chemically and electrically compatible conductor shoe electrically connecting said P-type element to said N-type element, the respective amounts of said GeTe and $AgSbTe_2$ present in said alloy being represented by the formula $(AgSbTe_2)_{1-x} + (GeTe)_x$, wherein $x$ is expressed in mol fraction and has values of about 0.80 and 0.85.

2. A thermoelectric device as defined in claim 1, wherein said N-type material is selected from the group consisting of lead, tin, telluride doped with lead iodide and lead telluride doped with lead iodide.

3. A P-type thermoelectric element containing an alloy consisting essentially of GeTe and $AgSbTe_2$, containing both rhombohedral and face-centered cubic crystals and having a ZT value in excess of 1.3 at 750°K, the respective amounts of said GeTe and $AgSbTe_2$ present in said alloy being represented by the formula $(AgSbTe_2)_{1-x} + (GeTe)_x$ wherein $x$ is expressed in mol fraction and has values of about 0.80 and 0.85.

* * * * *